(12) United States Patent
Cornwell

(10) Patent No.: US 8,476,901 B2
(45) Date of Patent: Jul. 2, 2013

(54) DIRECTED-ENERGY SYSTEMS AND METHODS FOR DISRUPTING ELECTRONIC CIRCUITS

(75) Inventor: James Cornwell, Irvine, CA (US)

(73) Assignee: Kaonetics Technologies, Inc., Fort Worth, TX (US)

( * ) Notice: Subject to any disclaimer, the term of this patent is extended or adjusted under 35 U.S.C. 154(b) by 1047 days.

(21) Appl. No.: 12/269,876

(22) Filed: Nov. 12, 2008

(65) Prior Publication Data

US 2013/0140448 A1    Jun. 6, 2013

Related U.S. Application Data

(60) Provisional application No. 60/987,691, filed on Nov. 13, 2007.

(51) Int. Cl.
*G01V 3/00* (2006.01)

(52) U.S. Cl.
USPC ............................................ 324/307; 324/309

(58) Field of Classification Search
CPC ............................. G01R 33/4808; G01R 33/28
USPC ..................... 347/55; 342/13, 359; 250/201; 324/307, 309
See application file for complete search history.

(56) References Cited

U.S. PATENT DOCUMENTS

| | | |
|---|---|---|
| 4,975,917 A | 12/1990 | Villa |
| 5,054,046 A | 10/1991 | Shoulders |
| 5,054,047 A | 10/1991 | Shoulders |
| 5,365,927 A | 11/1994 | Roemer |
| 5,594,296 A | 1/1997 | Mitsutake et al. |
| 5,682,412 A | 10/1997 | Skillicorn et al. |
| 5,912,469 A | 6/1999 | Okino |
| 6,124,596 A | 9/2000 | Nakasuji |
| 6,567,685 B2 | 5/2003 | Takamori |
| 6,657,594 B2 | 12/2003 | Anderson |
| 6,756,930 B1 | 6/2004 | Nunuparov et al. |

(Continued)

FOREIGN PATENT DOCUMENTS

| | | |
|---|---|---|
| CN | 2155600 | 2/1994 |
| EP | 1372104 | 12/2003 |

(Continued)

OTHER PUBLICATIONS

Supplementary Search Report issued on Apr. 8, 2011 in European Patent Appln. No. 08850425.3.

(Continued)

*Primary Examiner* — An Do
(74) *Attorney, Agent, or Firm* — Steven R. Vosen

(57) ABSTRACT

Disclosed are directed-energy systems and methods for disrupting electronic circuits, especially those containing semiconductors. A directed-energy system can include a charged particle generator configured to generate plural energized particles and a charge transformer configured to receive the plural energized particles that include charged particles and to output energized particles that include particles having substantially zero charge. The charged particle generator can be configured to direct the plural energized particles through the charge transformer in a predefined direction. A method for disrupting electronic circuits can include generating plural energized particles, directing the plural energized particles to an incident surface of a charge transformer and transforming the plural energized particles within the charge transformer. The transformed particles can be at substantially zero charge. The method can further include generating a wavefront at an exit surface of the charge transformer including the transformed particles and impinging an electronic circuit with the wavefront.

17 Claims, 2 Drawing Sheets

U.S. PATENT DOCUMENTS

| | | | |
|---|---|---|---|
| 6,784,408 | B1 | 8/2004 | Cheung et al. |
| 6,809,307 | B2 | 10/2004 | Byren et al. |
| 6,849,841 | B2 | 2/2005 | Byren et al. |
| 6,864,825 | B2 | 3/2005 | Holly |
| 7,061,241 | B2 | 6/2006 | Le Roux |
| 7,098,662 | B2 | 8/2006 | Hinks et al. |
| 7,126,530 | B2 * | 10/2006 | Brown .......................... 342/359 |
| 7,221,329 | B2 | 5/2007 | Cornwell |
| 2003/0179784 | A1 | 9/2003 | Minehara et al. |
| 2007/0259641 | A1 | 11/2007 | Gorrell et al. |
| 2007/0273244 | A1 | 11/2007 | Lal et al. |

FOREIGN PATENT DOCUMENTS

| | | |
|---|---|---|
| GB | 2429592 | 2/2007 |
| JP | 07-235257 | 9/1995 |
| WO | 2006086658 A1 | 8/2006 |

OTHER PUBLICATIONS

Notification of Transmittal of the International Search Report and the Written Opinion of the International Searching Authority (Forms PCT/ISA/220, PCT/ISA/210 and PCT/ISA/237) from International Application No. PCT/US2008/012831 dated Feb. 19, 2009 corresponding to U.S. Appl. No. 12/271,682.

International Search Report and Written Opinion dated May 19, 2009 from International Application No. PCT/US2008/012673 corresponding to U.S. Appl. No. 12/269,880.

International Search Report and Written Opinion dated May 29, 2009 from International Application No. PCT/US2008/012843 corresponding to U.S. Appl. No. 12/272,394.

International Search Report and Written Opinion dated May 25, 2009 from International Application No. PCT/US2008/012678 corresponding to U.S. Appl. No. 12/269,876.

International Search Report and Written Opinion dated Jun. 11, 2009 from International Application No. PCT/US2008/012672 corresponding to U.S. Appl. No. 12/269,878.

Cornwell, Copending U.S. Appl. No. 12/269,878, filed Nov. 12, 2008 entitled "Method and Apparatus for Enhancing Signal Carrier Performance in Wireless Networks".

Cornwell, Copending U.S. Appl. No. 12/271,682, filed Nov. 14, 2008 entitled "Wireless Identification System Using a Directed-Energy Device as a Tag Reader".

Cornwell, Copending U.S. Appl. No. 12/269,880, filed Nov. 12, 2008 entitled "Method of Producing a Highly Permeable Stable RF Wavefront Suitable as a Data Carrier".

Cornwell, Copending U.S. Appl. No. 12/272,394, filed Nov. 17, 2008 entitled "Directed-Energy Imaging System".

Extended Search Report issued on Feb. 14, 2012 in European Patent Application No. 08850913.8.

* cited by examiner

DIRECTED-ENERGY SYSTEMS AND METHODS FOR DISRUPTING ELECTRONIC CIRCUITS

CROSS-REFERENCE TO RELATED APPLICATIONS

This application claims priority from U.S. Provisional Patent Application Ser. No. 60/987,691, filed Nov. 13, 2007, the disclosure of which is hereby incorporated by reference in its entirety. This application also incorporates by reference in its entirety U.S. Provisional Patent Application Ser. No. 61/113,847, filed Nov. 12, 2008.

BACKGROUND

1. Field

The subject matter presented herein relates generally to directed-energy systems and methods, and more particularly, to directed-energy systems and methods for disrupting electronic circuits, especially those containing semiconductors.

2. Description of Related Art

The configuration and operation of known directed-energy devices can vary widely, as is illustrated by the disclosures of U.S. Pat. Nos. 6,809,307; 6,784,408; 6,849,841; 6,864,825 and 7,126,530, which are incorporated herein by reference in their entirety.

Known directed-energy devices can produce, for example, electromagnetic waves (EMW) and electromagnetic pulses (EMP), which propagate away from a source with diminishing intensity, governed by the theory of electromagnetism. An electromagnetic pulse (EMP) is in effect an electromagnetic shock wave.

This pulse of energy can produce a powerful electromagnetic field. The field can be sufficiently strong to produce short lived transient voltages of potentially thousands of volts on exposed electrical conductors, such as wires, or conductive tracks on printed circuit boards, where exposed.

The EMP effect can result in irreversible damage to a wide range of electrical and electronic equipment, particularly computers and radio or radar receivers. Subject to the electromagnetic hardness of the electronics, a measure of the equipment's resilience to this effect, and the intensity of the field produced, the equipment can be irreversibly damaged or in effect electrically destroyed. The damage inflicted is not unlike that experienced through exposure to close proximity lightning strikes, and may require complete replacement of the equipment, or at least substantial portions thereof.

Known computer and telecommunications equipment can be particularly vulnerable to EMP effects, as it is largely built up of high density Metal Oxide Semiconductor (MOS) devices, for instance, which can be very sensitive to exposure to high voltage transients. What can be significant about MOS devices is that very little energy is required to permanently damage or destroy them. Any voltage typically in excess of ten or tens of volts can produce an effect termed gate breakdown that effectively destroys the device. Even if a voltage pulse is not powerful enough to produce thermal damage, the power supply in the equipment can readily supply enough energy to complete the destructive process. Damaged devices may still function, but their reliability may be seriously impaired, or not function as intended or at all.

Shielding electronics by equipment chassis can provide limited protection, as any cables running in and out of the equipment can behave very much like antennae, in effect guiding the high voltage transients into the equipment.

Computers used in data processing systems, communications systems, displays, industrial control applications, including road and rail signaling, and those embedded in military equipment, such as signal processors, electronic flight controls and digital engine control systems, are all potentially vulnerable to the EMP effect.

Receivers can be particularly sensitive to EMP, as the highly sensitive miniature high frequency transistors and diodes in such equipment can be easily destroyed by exposure to high voltage electrical transients. Therefore, radar and electronic warfare equipment, satellite, microwave, UHF, VHF, HF and low band communications equipment and television equipment are all potentially vulnerable to the EMP effect.

A known effective countermeasure method to protect against the harmful effects of electromagnetism is to wholly contain equipment in an electrically conductive enclosure, termed a Faraday cage, which can prevent the electromagnetic field from gaining access to the protected equipment. A Faraday cage can be capable of stopping an attack using electromagnetism, such as an EMP.

SUMMARY

In an exemplary embodiment, a directed-energy system includes a charged particle generator configured to generate plural energized particles; and a charge transformer configured to receive the plural energized particles that include charged particles from the charged particle generator and to output energized particles that include particles having substantially zero charge, wherein the charged particle generator is configured to direct the plural energized particles through the charge transformer in a predefined direction.

An exemplary method of disrupting an electronic circuit can include generating plural energized particles; directing the plural energized particles to an incident surface of a charge transformer; transforming the plural energized particles within the charge transformer, wherein the transformed particles are at substantially zero charge; generating a wavefront at an exit surface of the charge transformer comprising the transformed particles at substantially zero charge; and impinging an electronic circuit with the wavefront comprising the transformed particles at substantially zero charge.

BRIEF DESCRIPTION OF THE DRAWINGS

As will be realized, different embodiments are possible, and the details disclosed herein are capable of modification in various respects, all without departing from the scope of the claims. Accordingly, the drawings and descriptions are to be regarded as illustrative in nature and not as restrictive. Like reference numerals have been used to designate like elements.

DETAILED DESCRIPTION

Figure 1:
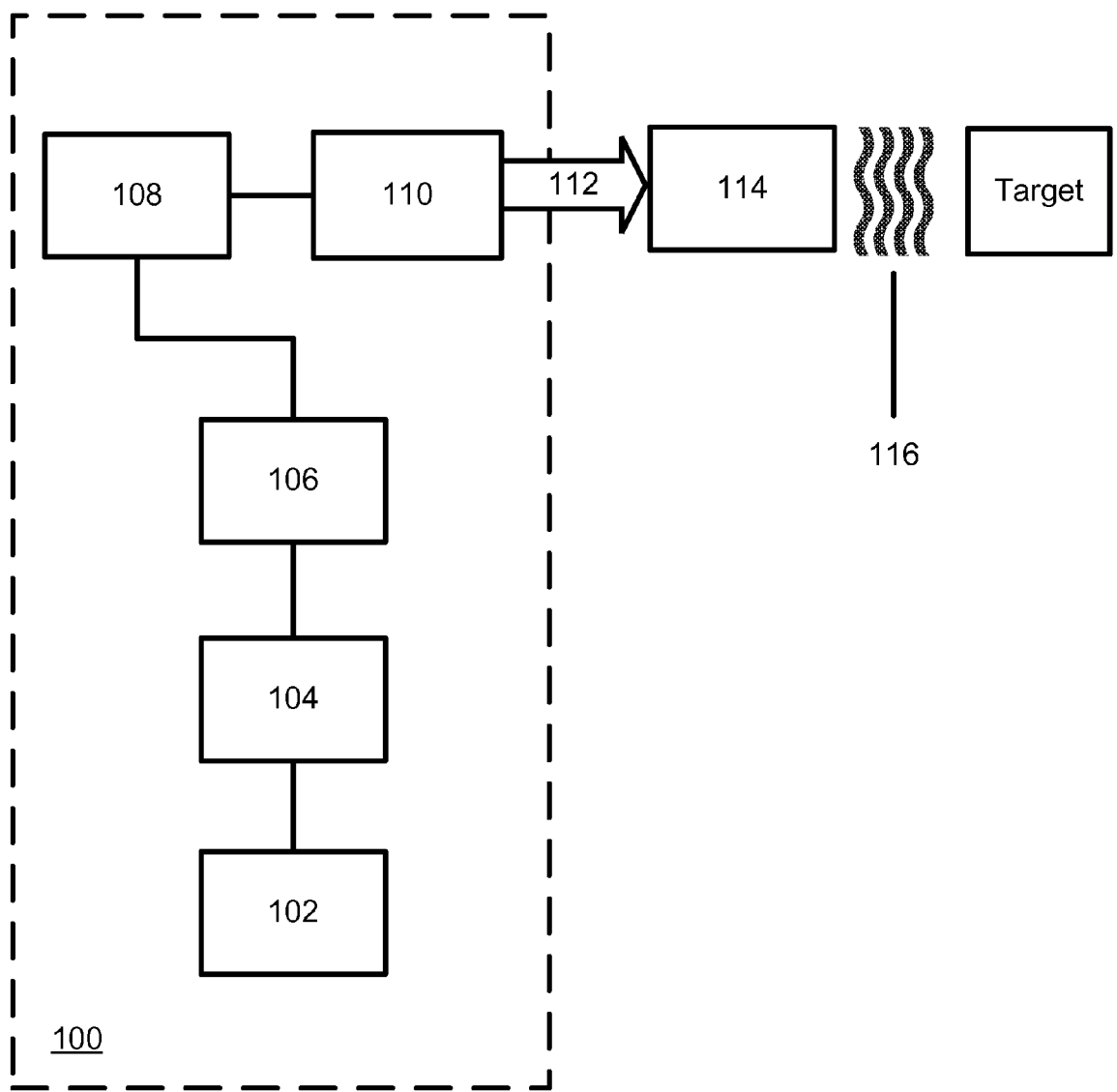
FIG. 1 shows a functional block diagram of an exemplary embodiment of a directed-energy system.
Figure 2:
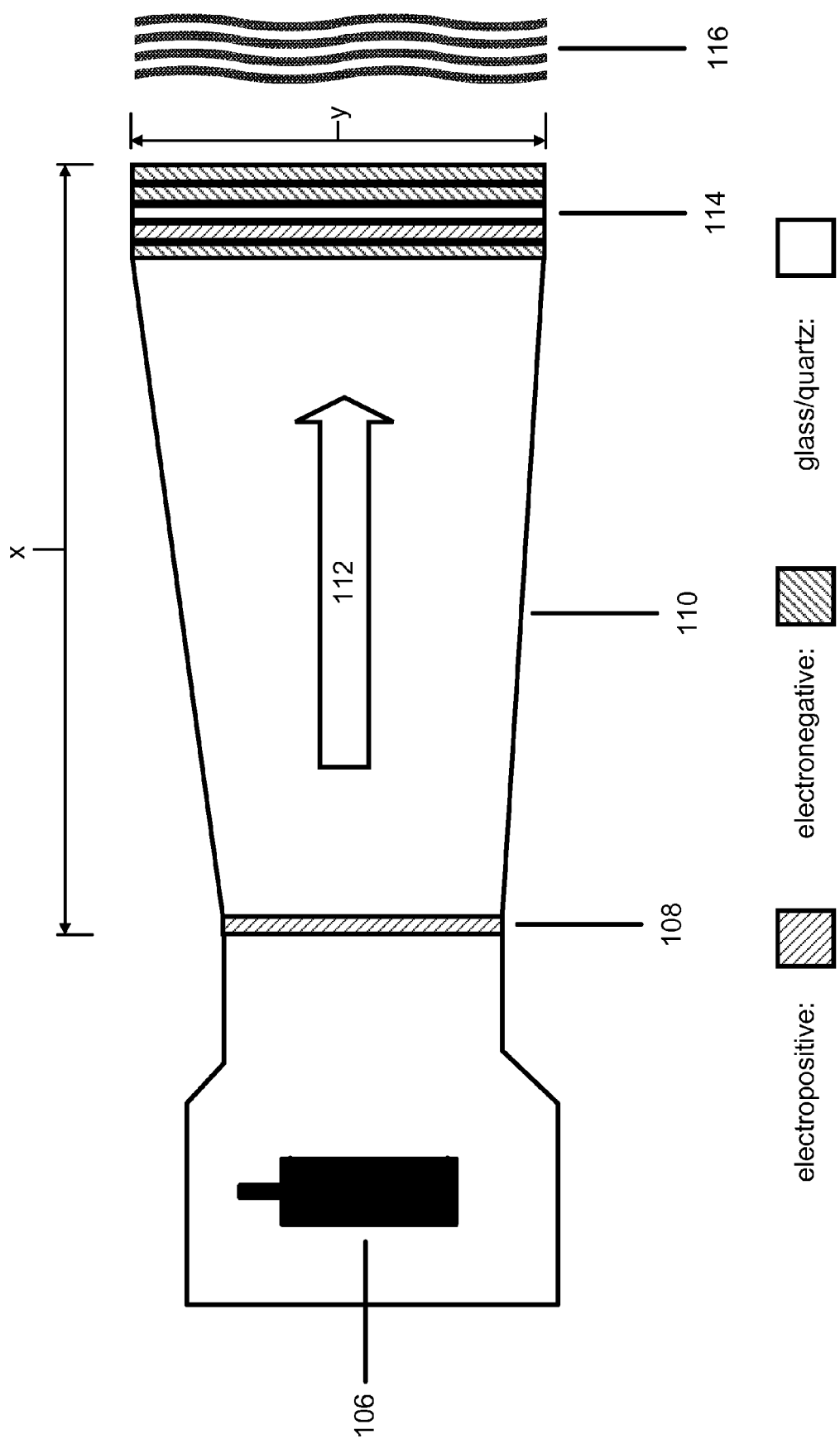
FIG. 2 shows a simplified cross-sectional view of portions of an exemplary embodiment of a directed-energy system.

Referring to FIGS. 1 and 2, an exemplary embodiment of a directed-energy system can include a charged particle generator 100 configured to generate plural energized particles and a charge transformer 114 configured to receive the plural energized particles that include charged particles from the charged particle generator and to output energized particles that include particles having substantially zero charge. The charged particle generator 100 can be configured to direct the plural energized particles through the charge transformer 114 in a predefined direction, e.g., toward a target device. In an exemplary embodiment, the plural energized particles can be in the form of a photon particle wave, e.g., a mixture or cross-generation of photons and electrons.

Power and control components will be known to those of skill in the art. For example, in an exemplary embodiment, energized particle generator 100 can include a DC power supply 102 and DC-to-AC converter 104.

In an exemplary embodiment, charged particle generator 100 can include charged particle emitter 106. In an embodiment, charged particle emitter 106 can include any source of radio frequency energy, particularly microwaves. In some embodiments, charged particle emitter 106 may include known magnetrons. In some other embodiments, charged particle emitter 106 may include solid-state power amplifiers, gyrotrons, traveling wave tubes (TWTs), and/or klystrons. In some embodiments, charged particle emitter 106 may be a lower-power source and may generate energy levels of approximately 1 kilowatt (kW) to approximately 100 kW or greater, although the scope is not limited in this respect.

Without limiting the scope of the invention, other examples of suitable charged particle emitters that can form a photon particle wave include known energy emission devices such as free electron lasers and discharges or arcs at edges of planar antennae, for example, spark gap generators.

In some embodiments, charged particle emitter 106 may include a free electron laser, or FEL. A FEL is a laser that shares the same optical properties as conventional lasers such as emitting a beam consisting of coherent electromagnetic radiation which can reach high power, but which uses some very different operating principles to form the beam. Unlike gas, liquid, or solid-state lasers such as diode lasers, which rely on bound atomic or molecular states, FELs use a relativistic electron beam as the lasing medium, hence the term free electron. This gives them a wide frequency range compared to other laser types, and makes many of them widely tunable, currently ranging in wavelength from microwaves, through terahertz radiation and infrared, to the visible spectrum, to ultraviolet, to soft X-rays.

In an exemplary embodiment, charged particle emitter 106 can include an excitation signal, produced by known signal generation devices, for example. Such an excitation signal could be a 120 VAC clipped (square) wave that can have an effect of driving a magnetron outside of a typical 2.45 GHz frequency, for example. In an embodiment, when a 120 VAC square wave excitation signal is applied to a magnetron, bandwidths on the order of 0 to 10 GHz can be achieved.

In an exemplary embodiment, the output of charged particle emitter 106 can be a photon particle wave that can include a mixture of photons and electrons.

In an exemplary embodiment, charged particle generator 100 can include an energized particle, e.g., photon and/or particle beam or wave, forming module 108. In an exemplary embodiment, energized particle (photon particle beam or wave) forming module 108 can be positioned in a throat section of a waveguide launcher between charged particle emitter 106 and waveguide 110.

In an exemplary embodiment, energized particle forming module 108 can be made of an electropositive material, such as a polycarbonate sheet. In an embodiment, this material can include DELRIN manufactured by DuPont. In an embodiment, energized particle forming module 108 can act like a roughing filter, i.e., it can start the process of reducing the charge of the charged particles in the mixture of photons and electrons. After passing through energized particle forming module 108, the mixture of photons and electrons can then be directed via waveguide 110 as an electromagnetic wavefront 112 to impinge on the surface of charge transformer 114.

In an exemplary embodiment, waveguide 110 can include a hollow conducting tube, which may be rectangular or circular, for example, within which EM waves can be propagated. Signals can propagate within the confines of metallic walls, for example, that act as boundaries.

In an exemplary embodiment, waveguide 110 can be configured as a circularly polarized antenna and may radiate substantially circularly polarized energy. In other embodiments, waveguide 110 may be linearly polarized and may radiate signals with a linear polarization (e.g., a horizontal and/or a vertical polarization). Antennas in many shapes, such as horns, lenses, planar arrays, and reflectors may be suitable in some of these embodiments.

As shown in FIG. 2, exemplary waveguide 110 can be configured as part of a device that can include a magnetron portion, a throat section of a waveguide launcher area that can include energized particle forming module 108 positioned between charged particle emitter 106 and waveguide 110, and a cone-like portion or horn. In an exemplary embodiment, a magnetron can be placed in the magnetron portion such that there can be a three-inch gap between the top of the magnetron's cathode and the top of the enclosure.

In an exemplary and non-limiting embodiment, waveguide 110 can be designed to promote sufficient velocity of the photon particle wave that can include a mixture of photons and electrons particles, here designated as EM wavefront 112, moving through the waveguide 110. Again referring to FIG. 2, x refers to a length of exemplary waveguide 110 (which can include energized particle forming module 108) and y refers to a height of an aperture opening at the end of waveguide 110. In an exemplary embodiment, the ratio of x/y can be approximately 3 to 3.5 to 1 to promote sufficient velocity of the particles moving through the waveguide 110. For example, assuming that the aperture opening height (y) is six inches, then waveguide 110 length can be from 18 to 21 inches. In another embodiment, a length of waveguide 110 can be based on the ratio of six times the air gap above an exemplary magnetron's cathode. Using the previously mentioned three-inch gap, this results in a waveguide length of eighteen inches.

In an exemplary embodiment, the aperture opening can be generally rectangular. In an embodiment, the aperture opening width can be eight inches for an aperture opening height (y) of six inches. In an exemplary embodiment, the length of the launcher area before the waveguide 110 can be approximately two inches.

In an exemplary embodiment, the interior surface of exemplary waveguide 110 can be coated with approximately two mils (0.002 inches) of a noble metal, such as 14-carat gold. Other noble metals can include ruthenium, rhodium, palladium, osmium, iridium and platinum. Such a coating can improve the gain characteristics of waveguide 110. An example of a suitable coating process that can be used to enhance the performance of antennas or waveguides may be found in U.S. Pat. No. 7,221,329, the disclosure of which is hereby incorporated by reference in its entirety.

In an embodiment, waveguide 110 can be configured to minimize backscatter of the energized particles using known techniques.

In an exemplary embodiment, EM wavefront 112 can be directed through charge transformer 114. In an embodiment, charge transformer 112 can have dielectric and physical characteristics such that the energized charged particles, e.g., electrons, in an EM wavefront 112 can be transformed. While not wishing to be bound by any particular theory, this may be done either by changing characteristics of the particle, or by generation or emission of different particles as a result thereof, thereby creating a wavefront 116 at the output of the charge transformer 114. Wavefront 116 can propagate toward a target device, e.g., a device containing an electronic circuit including a semiconductor. In an exemplary embodiment, wavefront 116 with energized particles can be focused and can be of high enough energy to allow for operations in, for example, a space of approximately 20 feet×30 feet. In an exemplary embodiment, a 600 W magnetron can produce a wavefront 116 of about 10 mW/cm$^2$ at the aperture, which can result in about 2 mW/cm$^2$ at 1 meter from the aperture, which can be an effective range for an embodiment.

In an exemplary embodiment, charge transformer 114 can include an incident surface for receiving the EM wavefront 112 and an exit surface for radiating the wavefront 116.

In an exemplary embodiment, charge transformer 114 can include a composite of glass and/or polycarbonate materials, for example, and can vary in shape. For example, flat plates or panes with parallel surfaces can be used as well as convex lenses of a desired focal length. Hybrid configurations with parallel surfaces at the center and convex surfaces at the edges can also be acceptable configurations.

Referring to FIG. 2, in an exemplary embodiment, charge transformer 114 can include at least one electronegative/electropositive material pair, i.e., an electronegative layer next to an electropositive layer, or vice versa, that first receives EM wavefront 112, followed by approximately ½ inch of glass or quartz, followed by two electronegative layers. In an exemplary embodiment, this assembly of layers can be vacuum-sealed in ABS plastic.

Suitable materials for the electronegative/electropositive material pair can include known materials that can exhibit electronegative/electropositive behavior. As previously mentioned, an electropositive material can include a polycarbonate sheet made of DELRIN, for example. Suitable polycarbonate can also be chosen for electronegative layers. In another embodiment, plate glass can be sputtered with metal oxides to achieve desired electronegative/electropositive behavior.

In an exemplary embodiment, the approximately ½ inch of glass layer can include leaded glass if additional dampening of the emitted zero-charge particle stream is desired.

In an exemplary embodiment, there can be plural pairs of electronegative/electropositive material that first receives EM wavefront 112 followed by a glass or quartz layer.

In an exemplary embodiment, horizontal and/or vertical slits or other openings can be formed into or cut out of charge transformer 114 so that in addition to wavefront 116 propagating from charge transformer 114, charged particles in EM wavefront 112 can also propagate from the device. A controlled amount of charged particles along with wavefront 116 may be useful depending on the operating environment. In an exemplary embodiment, the slits or other openings may be adjustable by an operator using known methods and/or materials. For example, tape, a slide mechanism, or an aperture mechanism could be used to adjust the slits.

Charge transformer 114 may incorporate known coating materials or multiple deposition layers on either the incident surface or the exit surface to aid in the wavefront 116 generation, and/or have abrasion or polishing performed on either surface to enhance desired characteristics of the charge transformer 114. Similarly, side surfaces may have similar operations performed to enhance the desired charge transformer 114 characteristics. Other compositions materials and combinations of materials may be used in the fabrication of the charge transformer 114 to achieve desired transformation effects. Additionally, other geometries may be used for charge transformer 114, including, without limitation, stacking additional charge transformer components in combinations that may reflect, refract or redirect EM wavefront 112.

In an exemplary embodiment, wavefront 116, after exiting charge transformer 114, is shown in FIG. 2 impinging on a target device, which in an exemplary embodiment can be up to one meter away. Wavefront 116 can propagate through free space until it impinges an electronic device where it can disrupt the operation of semiconductors therein, for example.

In an exemplary embodiment, a sighting device, such as a laser rifle scope or sight, can be incorporated into an exemplary directed-energy system and used to help direct the wavefront 116.

An exemplary method for disrupting the operation of an electronic device can include generating plural energized particles, directing the plural energized particles to an incident surface of a charge transformer and transforming the plural energized particles within the charge transformer. The transformed particles can be at substantially zero charge and include substantially zero charge particles. A method can further include generating a wavefront at an exit surface of the charge transformer comprising the transformed particles at substantially zero charge and impinging an electronic circuit with the wavefront comprising the transformed particles at substantially zero charge.

Transforming the plural energized particles within the charge transformer can include laterally aligning the plural energized particles to produce a polarization of the plural energized particles. The plural energized particles can be generated by cross-generation of photons and electrons.

Various system components described above may be resized depending on the system parameters desired. For example, charge transformer 114 and waveguide 110 can be made larger or smaller and can have different dimensions and geometries depending, for example, on the power or distance requirements of a particular application. Exemplary directed-energy systems can be sized for operation within a room, e.g., a floor space of approximately 20 feet×30 feet. Additionally, an exemplary charged particle emitter 106 may be configured by those skilled in the art to have multiple voltages, frequencies, and power levels.

The precise theory of operation of the charged particle generator 100 in combination with the charge transformer 114 is not entirely understood. Without wishing to be bound by any theory, it is believed that the charge transformer 114 reduces the charge in the EM wavefront 112. Based on empirical data to date, it has been determined through experimentation, using, for example, exemplary embodiments described herein, that the particles in wavefront 116 are at a zero-charge state and approximately the same mass as an electron (9.10938188×10$^{-31}$ kilograms).

While reiterating that the precise theory of operation is not entirely understood, it is believed that the effect is such that when a wavefront of exemplary zero-charge particles with sufficient energy density impinges a circuit, including a semiconductor, for example, the kinetic energy of the particles, rather than an associated electromagnetic charge, causes a type of saturation of the semiconductor. It is possible that the zero-charge particles impinging on semiconductor react with impurities, e.g., metal oxides, present in the semiconductors, to cause a resonant frequency. This resonant frequency may cause mechanical or physical oscillations in a defect region of a semiconductor, which in turn may cause electron flow to stop or become greatly reduced because a physical travel path for the electrons and/or holes (charge carriers) has been disrupted, e.g., in a gate region of the semiconductor. Experimental observations have shown that a semiconductor may be temporarily disrupted for the amount of time the zero-charge particles are impinging on the semiconductor.

Unlike systems that rely exclusively on an electromagnetic field or charged particles to gain access to protected equipment for disruptive purposes, it is believed, based on experimental observations, that an exemplary embodiment of a directed-energy system using zero-charge particles can be an effective way to defeat known countermeasure methods, such as Faraday cages, The above description is presented to enable a person skilled in the art to make and use the systems and methods described herein, and is provided in the context of a particular application and its requirements. Various modifications to the embodiments will be readily apparent to those skilled in the art, and the generic principles defined herein may be applied to other embodiments and applications without departing from the spirit and scope of the claims. Thus, there is no intention to be limited to the embodiments shown, but rather to be accorded the widest scope consistent with the principles and features disclosed herein.

What is claimed is:

1. A directed energy system comprising:
   a housing formed of metal and including a magnetron portion and a waveguide portion, the waveguide portion including a throat section in communication with the magnetron portion and a horn section having an opening, the horn section in communication with and larger than the throat section;
   a power supply configured to produce an excitation signal comprising at least one of a V AC square wave and a chopped alternating current signal;
   a magnetron located within the magnetron portion and spaced from the throat section; the magnetron configured to receive the excitation signal from the power supply in order to emit a plurality of energized particles within the magnetron portion;
   an energized particle forming module arranged and configured in the throat section of the housing, the energized particle forming module including an electropositive material; and
   a charge transformer comprising an electropositive and an electronegative layer arranged and located in the horn section and at least partially covering the opening.

2. The system of claim 1, wherein the system is configured and adapted to emit particles from said charge transformer.

3. The system of claim 1, wherein the excitation signal is a non-sinusoidal excitation signal in order to power the magnetron to produce broad band radio frequency emissions below, above and including the typical 2.45 GHz frequency of a magnetron.

4. The system of claim 3, wherein the excitation signal is configured and adapted to power the magnetron in order to generate radio frequencies having a bandwidth on the order of 0 to about 10 GHz.

5. The system of claim 1, wherein said charge transformer is composed of a material different than the housing.

6. The system of claim 1, wherein said charge transformer comprises a polycarbonate material or other electropositive dielectric material.

7. The system of claim 1, wherein said charge transformer comprises an electronegative dielectric material.

8. The system of claim 7, wherein the charge transformer comprises DELRIN®.

9. The system of claim 1, further comprising a wave guide, the wave guide in communication with said horn section.

10. The system of claim 9, wherein a ratio of the length of the wave guide to a height of an aperture opening at the end of the wave guide is about 3 to about 3.5 to 1.

11. The system of claim 10, wherein an interior surface of the wave guide comprises a coating of noble metal.

12. The system of claim 9, wherein the wave guide comprises a horn antenna.

13. The system of claim 1, wherein system is configured and adapted to generate the plurality of energized particles and/or a photon particle wave at power levels of approximately 11 kilowatt (KW) to approximately 1100 KW.

14. The system of claim 1, wherein the magnetron is positioned within the housing such that there is about a three-inch gap between the top of the magnetron's cathode and the housing.

15. The system of claim 1, wherein the magnetron is positioned in the housing about two (2) inches in front of said charge transformer that at least partially covers the opening in the housing.

16. The system of claim 1, wherein said charge transformer material comprises a layer comprising at least one of glass and quartz.

17. The system of claim 1, wherein said charge transformer material comprises one or more openings.

* * * * *